United States Patent [19]

Tanaka et al.

[11] Patent Number: 5,559,737
[45] Date of Patent: Sep. 24, 1996

[54] NONVOLATILE SEMICONDUCTOR MEMORY CAPABLE OF SIMULTANEOUSLY EQUALIZING BIT LINES AND SENSE LINES

[75] Inventors: Sumio Tanaka; Shigeru Atsumi, both of Tokyo; Masao Kuriyama, Kawasaki, all of Japan

[73] Assignee: Kabushiki Kaisha Toshiba, Kawasaki, Japan

[21] Appl. No.: 338,827

[22] Filed: Nov. 10, 1994

Related U.S. Application Data

[62] Division of Ser. No. 917,958, Jul. 24, 1992, abandoned.

[30] Foreign Application Priority Data

Jul. 25, 1991 [JP] Japan .................... 3-186438

[51] Int. Cl.$^6$ .................................. G11C 16/06
[52] U.S. Cl. .................. 365/185.25; 365/185.21; 365/185.20; 365/233.5; 365/189.07; 365/189.09; 365/189.11
[58] Field of Search .................... 365/202, 203, 365/185, 190, 207, 208, 210, 233.5, 185.20, 185.21, 185.25, 189.07, 189.09, 189.11

[56] References Cited

U.S. PATENT DOCUMENTS

| | | | |
|---|---|---|---|
| 4,494,219 | 1/1985 | Tanaka et al. | 365/185.2 |
| 4,884,241 | 11/1989 | Tanaka et al. | 365/210 |
| 4,951,257 | 8/1990 | Imamiya et al. | 365/185.2 |
| 5,138,579 | 8/1992 | Tatsumi et al. | 365/203 |
| 5,157,626 | 10/1992 | Watanabe | 365/185.2 |
| 5,237,534 | 8/1993 | Tanaka et al. | 365/208 |
| 5,241,505 | 8/1993 | Hashimoto | 365/210 |
| 5,245,574 | 9/1993 | Frary et al. | 365/189.09 |
| 5,258,958 | 11/1993 | Iwahashi et al. | 365/210 |
| 5,258,959 | 11/1993 | Dallabora et al. | 365/210 |
| 5,289,412 | 2/1994 | Frary et al. | 365/185 |
| 5,297,079 | 3/1994 | Ha | 365/182 |

FOREIGN PATENT DOCUMENTS

WO16069  12/1990  WIPO.

*Primary Examiner*—David C. Nelms
*Assistant Examiner*—Andrew Q. Tran
*Attorney, Agent, or Firm*—Banner & Allegretti, Ltd.

[57] ABSTRACT

In a nonvolatile semiconductor memory having a two-stage sense read circuit using a level shift circuit and a single-end sense amplifier, relationships of sizes of a main memory cell bit line charge transistor, a main memory cell bit line transfer gate transistor, a main memory cell bit line load transistor, a dummy cell bit line charge transistor, a dummy cell bit line transfer gate transistor, and a dummy cell bit line load transistor are set to simultaneously satisfy conditions for equalizing a bit line and a dummy cell bit line and conditions for equalizing a sense line and a dummy cell sense line. Therefore, the potentials of the bit line and the dummy cell bit line and the potentials of the sense line and the dummy cell sense line can be simultaneously equalized, and a high-speed read operation can be achieved.

11 Claims, 9 Drawing Sheets

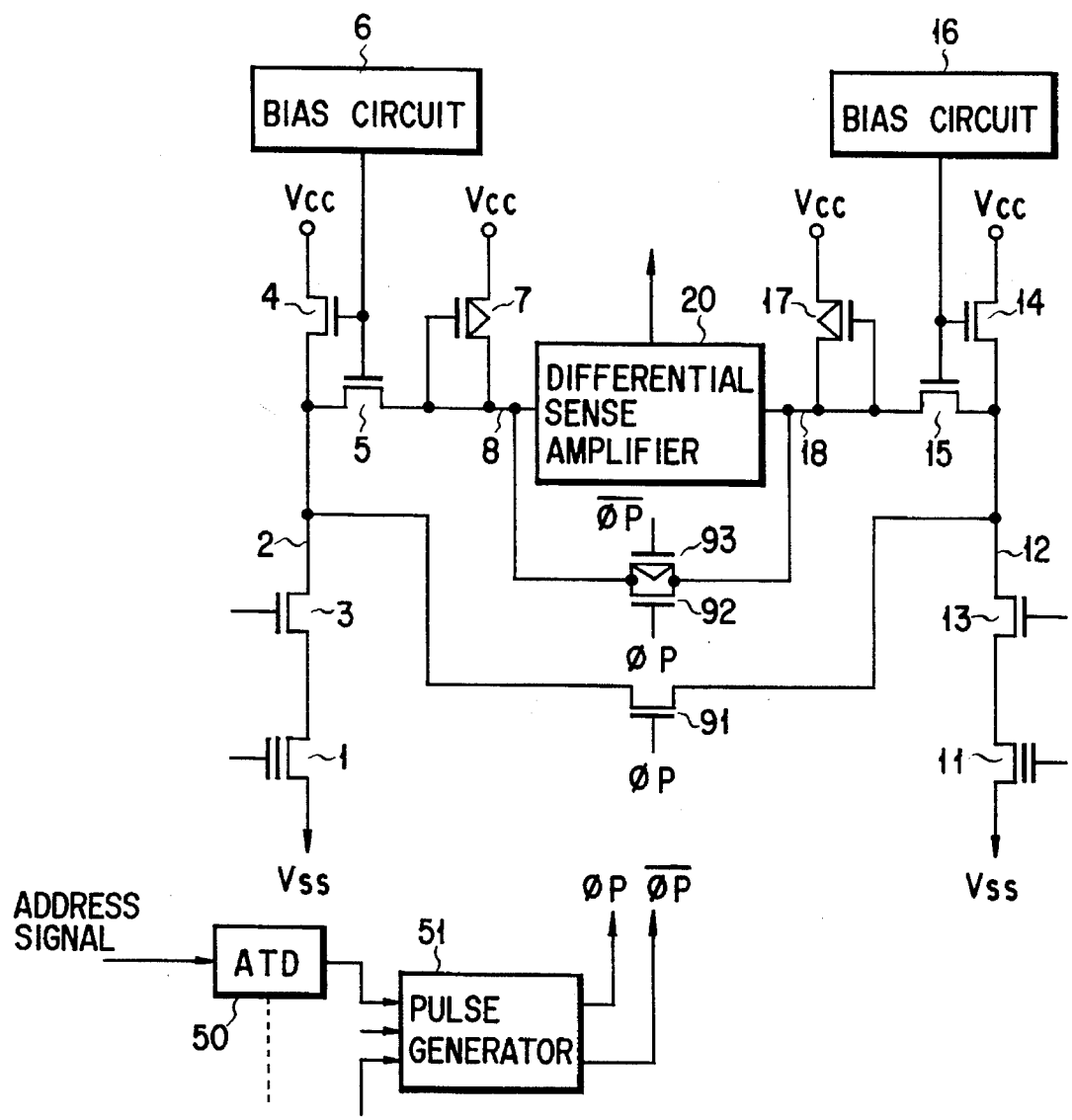
F I G. 2

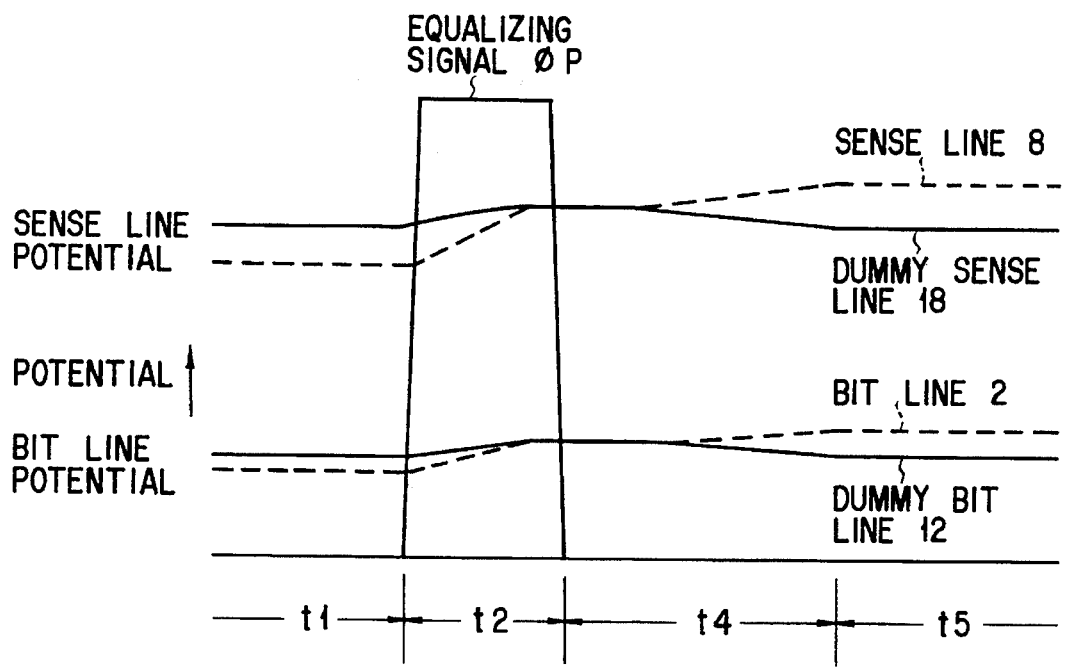
F I G. 6
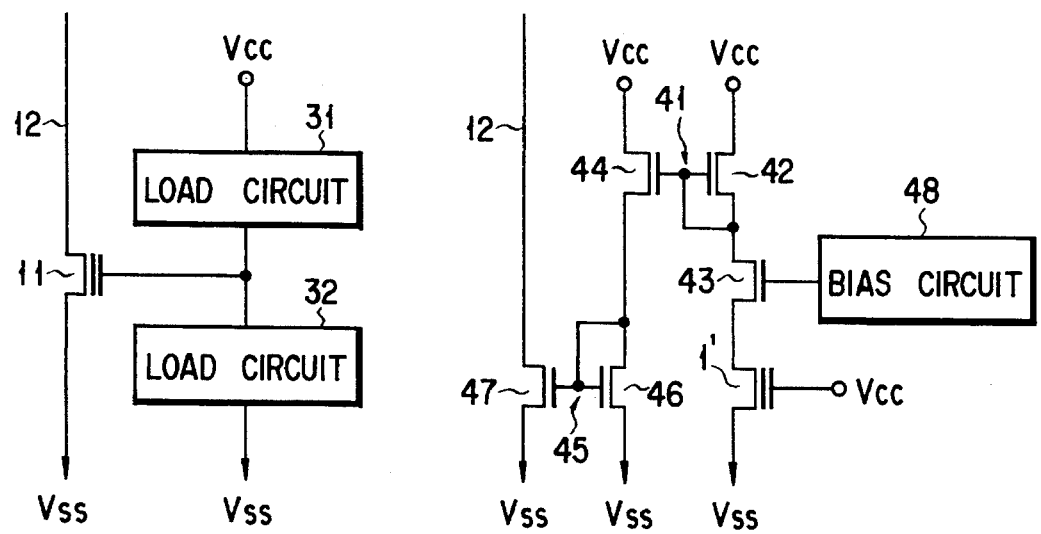
F I G. 7    F I G. 8

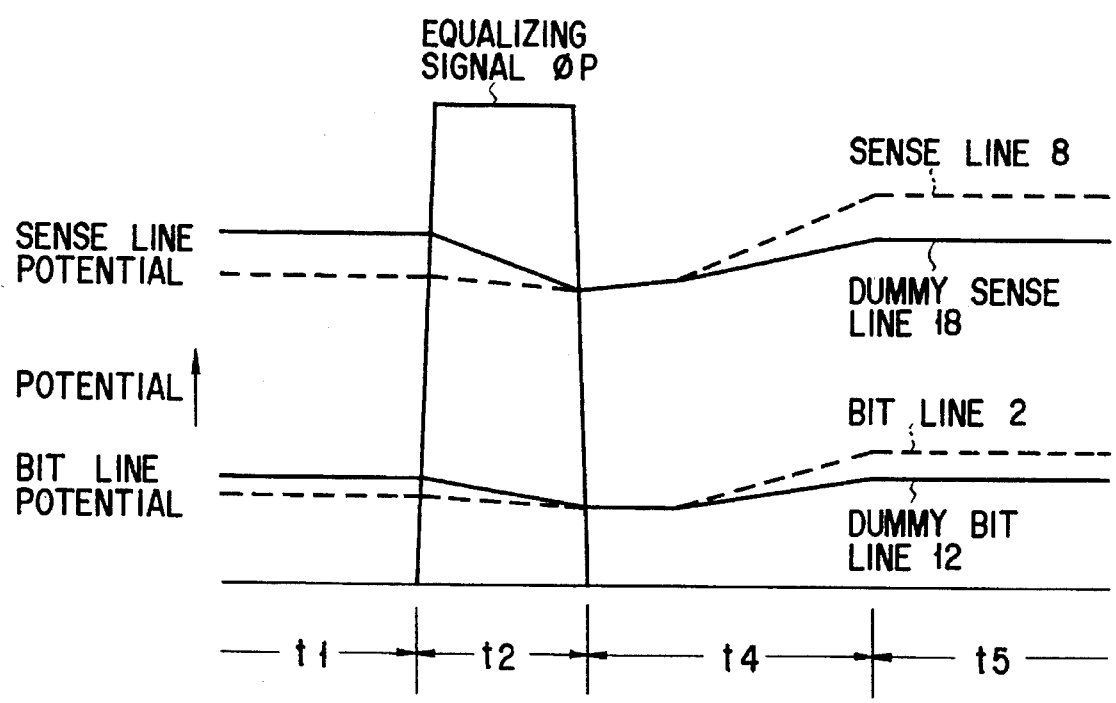
F I G. 12

NONVOLATILE SEMICONDUCTOR MEMORY CAPABLE OF SIMULTANEOUSLY EQUALIZING BIT LINES AND SENSE LINES

This application is a division of application Ser. No. 07/917,958, filed Jul. 24, 1992, abandoned.

BACKGROUND OF THE INVENTION

1. Field of the Invention

The present invention relates to a nonvolatile semiconductor memory and, more particularly, to a read circuit of a nonvolatile semiconductor memory of two-stage sense system using a level shift circuit and a single-ended sense amplifier.

2. Description of the Related Art

FIG. 1 is a circuit diagram showing a conventional read circuit in an EPROM (Ultra-violet Erasable/Programmable Read-Only Memory). This circuit is basically the same as a circuit described by M. A. Van Buskirk et al., "A 200 ns 256K HMOSII EPROM" 1983 ISSCC DIGEST OF TECHNICAL PAPERS, pp. 162–163, p. 301 or M. A. Van Buskirk et al., "EPROMs graduate to 256-K density with scaled n-channel process" Electronics/Feb. 24, 1983, pp. 89–93. For the sake of descriptive convenience, the circuit is slightly modified.

In FIG. 1, reference symbols Vcc and Vss denote a power source potential (normally 5 V) and a ground potential, respectively. Reference numeral 1 denotes a memory cell (main memory cell) for holding and decreasing the potential of a bit line 2 in accordance with the content of stored data by discharging the potential; 3, a column selection enhancement N-channel transistor; 4, a bit line charge enhancement N-channel transistor; 5, a bit line transfer gate enhancement N-channel transistor; 6, a bias circuit; 7, a bit line load enhancement P-channel transistor having a gate and a drain connected to each other; 8, a sense line; 11, a dummy cell for discharging the potential of a dummy cell bit line 12 to decrease the potential; 13, a dummy column selection enhancement N-channel transistor; 14, a dummy cell bit line charge enhancement N-channel transistor; 15, a dummy cell bit line transfer gate enhancement N-channel transistor; 16, a dummy cell bias circuit; 17, a dummy cell bit line load enhancement P-channel transistor having a gate and a drain connected to each other; 18, a dummy cell sense line; and 20, a differential sense amplifier. The bias circuit 6 is used to apply a predetermined bias potential (e.g., about 3 V) to the transistors 4 and 5 during read access. The transistors 4 and 5 are set to have a threshold voltage of about 1.5 V including a substrate bias effect so that they operate to clamp a bit line potential at a voltage of about 1.5 V. The potential is clamped as described above to prevent soft write access during long-time read of the main memory cell 1. The dummy cell bias circuit 16 has the same arrangement as that of the bias circuit 6, and the dummy cell transistors 14 and 15 clamp a dummy cell bit line potential at a voltage of about 1.5 V as in the operation of the transistors 4 and 5. In the circuit of FIG. 1, a single-ended sense amplifying scheme in which a readout potential from the main memory cell 1 is input to the sense amplifier 20 and compared with a reference potential (a readout potential from the dummy cell 11) is used. In addition, a two-stage sense scheme in which the readout potential from the main memory cell 1 is amplified by the bit line transfer gate transistor 5 and then input to the sense amplifier 20 is also used.

An operation of the circuit in FIG. 1 will be described below. When the main memory cell 1 is set in a programmed state (OFF state), the potential of the bit line 2 goes to high level when the column selection transistor 3 is set in an ON state. In this example, the high level is 1.5 V. In contrast to this, when the main memory cell 1 is set in an erase state (ON state), the potential of the bit line 2 goes to low level when the column selection transistor 3 is set in an ON state. This low level can be set to be 1.2 V when the sizes of the bit line charge transistor 4 and the bit line transfer gate transistor 5 are adjusted. Therefore, the bit line potential can fall within an amplitude of about 0.3 V. In addition, when the threshold voltage of the bit line load transistor 7 is −1 V, the potential of the sense line 8 goes to 4 V when the bit line potential is set at high level (1.5 V). When the size of the bit line load transistor 7 is adjusted, the potential of the sense line 8 can be set to be, e.g., 3 V when the bit line potential is set at low level (1.2 V). That is, the small amplitude (0.3 V) of the bit line 2 is amplified to 1 V. A circuit scheme for amplifying the small amplitude of a bit line potential by the transfer gate transistor 5 and the load transistor 7 is to be referred to as a level shift circuit scheme hereinafter.

In this case, the sizes of the dummy cell 11, the dummy cell column selection transistor 13, the bit line charge transistor 14, and the dummy bit line transfer gate transistor 15 are set to be equal to the sizes of the main memory cell 1, the main memory cell column selection transistor 3, the bit line charge transistor 4, and the bit line transfer gate transistor 5, respectively. Therefore, when the dummy cell 11 is set in an erase state, and the power source potential Vcc is applied to the control gate of the dummy cell 11, currents having the same magnitude flow in the bit line charge transistor 4 and the dummy cell bit line charge transistor 14 when the selected main memory cell 1 is set in an erase state. The size of the dummy cell bit line load transistor 17 is set to be larger than that of the main memory cell bit line load transistor 7, and the conductance of the dummy cell bit line load transistor 17 is set to be higher than that of the main memory cell bit line load transistor 7. In this case, the potential of the dummy cell sense line 18 is higher than the low level of the main memory cell sense line 8. At the same time, when the conductance of the dummy cell bit line load transistor 17 is adjusted, the potential of the dummy cell sense line 18 can be set to be lower than the high level of the main memory cell sense line 8 (the potential is set at an intermediate level between the low and high levels of the main memory cell sense line 8). Therefore, when the potentials of the main memory cell sense line 8 and the dummy cell sense line 18 are compared with each other and amplified by the sense amplifier 20, it can be determined whether the main memory cell 1 is set in a programmed state.

Conventionally, in an SRAM (static memory) or a DRAM (dynamic memory), a high-speed read operation is achieved by a technique for equalizing the potentials of a pair of complementary bit lines. A pulse signal (equalizing signal) used for this equalization is supplied from an external circuit or generated by an internal circuit (address transition detector) in which transition of an address signal input is detected to generate a signal having a predetermined pulse width. Consequently, in the circuit of FIG. 1, a high-speed read operation is expected to be achieved by equalizing the potentials of the bit line 2 and the dummy cell bit line 12 or the potentials of the sense line 8 and the dummy cell sense line 18.

There is an attempt to apply the above equalization technique to the circuit in FIG. 1. A typical example of this attempt is made by W. Ip et al., "256 Kb CMOS EPROM" February 1984, ISSCC DIGEST OF TECHNICAL PAPERS, pp. 138–139, (FIG. 3), or H. Nakai et al. "A 36 ns 1M bit CMOS EPROM with new data sensing technique" Symposium on VLSI Circuits, pp. 95–96, 1990 (FIG. 1). In the former, only the potentials of a bit line and a dummy cell bit line are equalized. In the latter, only the potentials of a sense line and a dummy cell sense line are equalized. However, there is no literature describing that the potentials of a bit line and a dummy cell bit line and the potentials of a sense line and a dummy cell sense line are simultaneously equalized, because conditions for equalizing the potentials of the bit line and the dummy cell bit line cannot be preferably matched with conditions for equalizing the potentials of the sense line and the dummy cell sense line. In addition, in the circuit of FIG. 1, when a read current (to be referred to as a cell current hereinafter) when the main memory cell 1 is turned on is decreased, a switching speed of the main memory cell 1 is rapidly decreased, and a read rate largely depends on the cell current.

As described above, in a read circuit of two-stage sense system using a level shift circuit and a single-ended sense amplifier and frequently applied to a conventional nonvolatile semiconductor memory, the potentials of the bit line and the dummy cell bit line or the potentials of the sense line and the dummy cell sense line are not equalized. For this reason, a high-speed read operation is not sufficiently achieved, and a read rate largely depends on a cell current.

SUMMARY OF THE INVENTION

The present invention has been made to solve the above drawbacks, and has as its object to provide a non-volatile semiconductor memory capable of simultaneously and perfectly equalizing the potentials of a bit line and a dummy cell bit line and the potentials of a sense line and a dummy cell sense line and sufficiently achieving a high-speed read operation.

It is another object of the present invention to provide a nonvolatile semiconductor memory in which dependency of a read rate on a cell current is small and a decrease in read rate is small even when the cell current is small.

According to an aspect of the present invention, there is provided a nonvolatile semiconductor memory comprising a bit line, a nonvolatile memory cell for holding and decreasing a potential of the bit line in accordance with a content of stored data by discharging the potential, a sense line connected to the bit line through a first transfer gate, a dummy bit line, a dummy cell for decreasing a potential of the dummy bit line by discharging the potential, a first equalizing circuit, controlled by a precharge signal, for equalizing potentials of the sense line and the dummy sense line during a precharge period, a second equalizing circuit, controlled by the precharge signal, for equalizing potentials of the bit line and the dummy bit line during the precharge period, and a sense amplifier for comparing the potentials of the sense line and the dummy sense line with each other and amplifying and outputting a difference between the potentials.

According to another aspect of the present invention, there is provided a nonvolatile semiconductor memory comprising a bit line, a nonvolatile memory cell for holding and decreasing a potential of the bit line in accordance with a content of stored data by discharging the potential, a first transfer gate connected between the bit line and a first node of a sense line and having a gate applied with a bias voltage of a predetermined value, a first load circuit for charging the first node, a dummy bit line, a dummy cell for decreasing a potential of the dummy bit line by discharging the potential, a second transfer gate connected between the dummy bit line and a second node of the dummy bit line and having a gate applied with a bias voltage of a predetermined value, a second load circuit for charging the second node, a first equalizing circuit, controlled by a precharge signal, for equalizing potentials of the first and second nodes during a precharge period, a second equalizing circuit for equalizing potentials of the bit line and the dummy bit line during the precharge period, and a sense amplifier for comparing the potentials of the first and second nodes with each other and amplifying and outputting a difference between the potentials, wherein a conductance ratio of the first load circuit to first transfer gate and a conductance ratio of the second load circuit to the second transfer gate are set within a predetermined range.

According to still another aspect of the present invention, there is provided a nonvolatile semiconductor memory comprising a bit line, a nonvolatile memory cell for holding and decreasing a potential of the bit line in accordance with a content of stored data by discharging the potential, a first transfer gate connected between the bit line and a first node of a sense line and having a gate applied with a bias voltage of a predetermined value, a first load circuit for charging the first node, a dummy bit line, a dummy cell for decreasing a potential of the dummy bit line by discharging the potential, a second transfer gate connected between the dummy bit line and a second node of the dummy bit line and having a gate applied with a bias voltage of a predetermined value, a second load circuit for charging the second node, a first equalizing circuit, controlled by a precharge signal, for equalizing potentials of the first and second nodes during a precharge period, a second equalizing circuit for equalizing potentials of the bit line and the dummy bit line during the precharge period, a sense amplifier for comparing the potentials of the first and second nodes with each other and amplifying and outputting a difference between the potentials, and a circuit for discharging the bit line and the dummy bit line during the precharge period, wherein a ratio of a size of the first load circuit to a conduction of the first transfer gate and a ratio of a size of the second load circuit to a conduction of the second transfer gate are set within a predetermined range.

Since a size ratio of a bit line load P-channel transistor to a transfer gate transistor is set to be almost equal to a size ratio of a dummy bit line load P-channel transistor to a transfer gate transistor, after equalization of the potentials of the bit line and the dummy cell bit line and the potentials of the sense line and the dummy cell sense line is completed, a potential relationship between the sense line and the dummy cell sense line is prevented from temporarily being reversed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing a part of an EPROM according to the first embodiment of the present invention;

FIG. 6 is a waveform chart showing a read operation of the circuit in FIG. 5;

FIG. 7 is a circuit diagram showing another arrangement of the dummy cell circuit in FIG. 5;

FIG. 8 is a circuit diagram showing still another arrangement of the dummy cell circuit in FIG. 5;

FIG. 12 is a waveform chart showing a read operation of the circuit in FIG. 11.

DETAILED DESCRIPTION OF THE PREFERRED EMBODIMENTS

Figure 1:
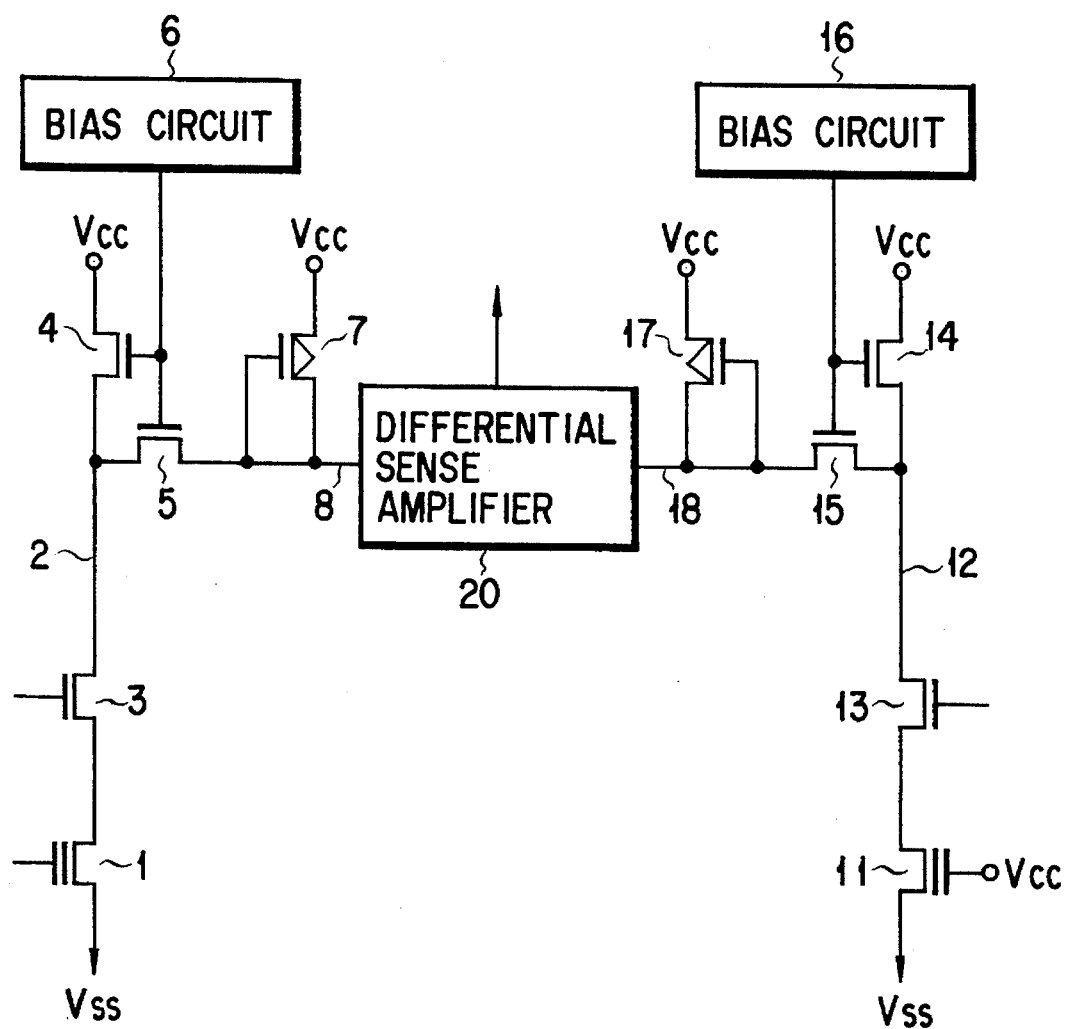
FIG. 1 is a circuit diagram showing a conventional read circuit in an EPROM.

Embodiments of nonvolatile semiconductor memories according to the present invention will be described below with reference to the accompanying drawings.

FIG. 2 is a circuit diagram showing a part of an EPROM of a nonvolatile semiconductor memory according to the first embodiment of the present invention. In the circuit of FIG. 2, a technique for simultaneously equalizing the potentials of a bit line and a dummy cell bit line and the potentials of a sense line and a dummy cell sense line is applied. A circuit used in this case has the following arrangement. As shown in FIG. 2, an equalizing enhancement N-channel transistor 91 is connected between the bit line and the dummy cell bit line, an equalizing enhancement N-channel transistor 92 and an enhancement P-channel transistor 93 are parallelly connected between the sense line and the dummy cell sense line. A signal $\phi p$ of complementary equalizing signals $\phi p$ and $\overline{\phi p}$ generated by an address transition detector 50 and a pulse generator 51 is supplied to the gates of the N-channel transistors 91 and 92. The signal $\overline{\phi p}$ is supplied to the gates of the P-channel transistor 93.

Figure 3:
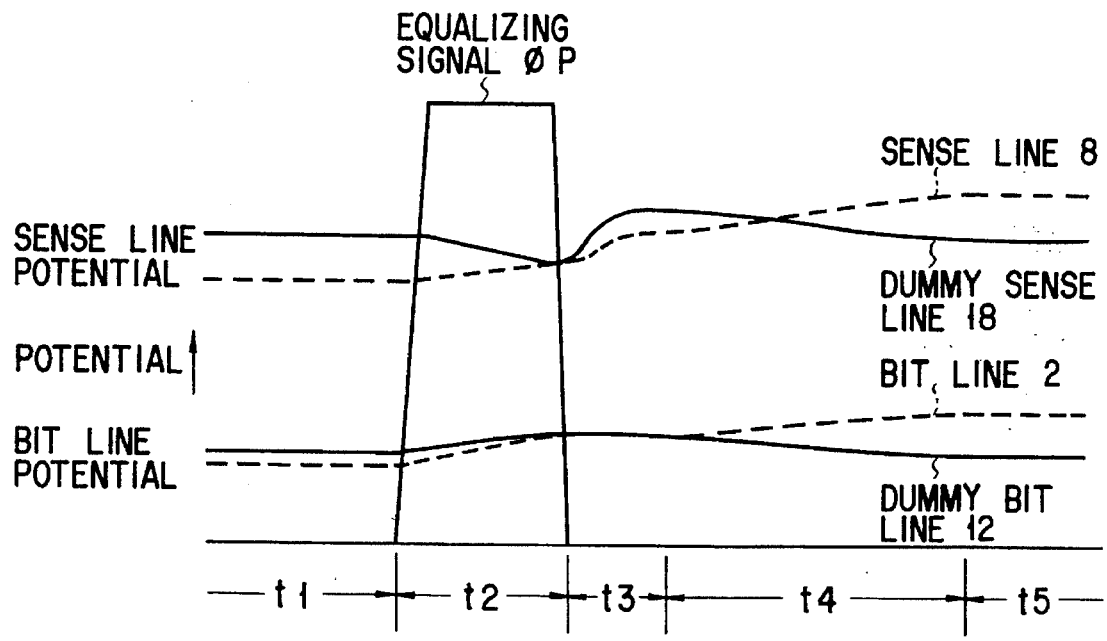
FIG. 3 is a waveform chart showing a read operation of the circuit in FIG. 2.
Figure 4:
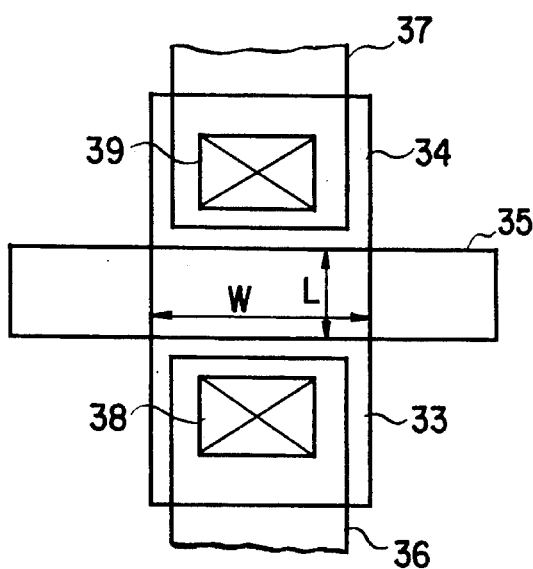
FIG. 4 is a plan view for explaining the sizes of the transistors in FIG. 2.

FIG. 3 shows waveforms of the equalizing signal $\phi p$, the bit line potential, the dummy cell bit line potential, the sense line potential, and the dummy cell sense line potential during read access when the size ratio of a dummy cell bit line load transistor 17 to a bit line load transistor 7 is assumed to be 2.5. In this case, the sizes of the transistors represent values of channel width W/channel length L as shown in FIG. 4. In FIG. 4, reference numeral 33 denotes a source region; 34, a drain region; 35, a gate region; 36 and 37, electrodes; and 38 and 39, contact holes. FIG. 3 shows that the bit line potential is finally switched from low level to high level when a main memory cell 1 is set in a programmed state, and a cell current is set to be zero. When a column selection transistor 3 and a dummy cell column selection transistor 13 are set in an ON state, the main memory cell 1 and a dummy cell 11 are set in an ON state in a period t1 in which the equalizing signals $\phi p$ and $\overline{\phi p}$ are not generated yet. Since currents having the same amplitude flow in the loads of the transistors 3 and 13, the bit line potential and the dummy cell bit line potential are set to be low level. In this case, the low level of the bit line potential is 3 V, and the low level of the dummy cell bit line potential is 3.5 V (intermediate potential). In a period t2 in which the equalizing signals $\phi p$ and $\overline{\phi p}$ are generated, equalizing transistors are turned on, the bit line potential becomes equal to the dummy cell bit line potential, and the sense line potential becomes equal to the dummy cell sense line potential. In a period t3 which starts from the end of generation of the equalizing signals $\phi p$ and $\overline{\phi p}$, since a bit line 2 and a dummy cell bit line 12 have large capacitances, their potentials are maintained at the same potential for a while. However, the capacitances of a sense line 8 and a dummy cell sense line 18 are smaller than those of the bit line 2 and the dummy cell bit line 12, and the size ratio of a bit line load transistor 4 to a transfer gate transistor 5 is different from the size ratio of a dummy bit line load transistor 14 to a transfer gate transistor 15. For this reason, the sense line 8 and the dummy cell sense line 18 easily and temporarily have a potential relationship reverse to a potential relationship to be finally set. In the period t4 following the period t3, the potential of the bit line 2 goes toward the potential to be finally set. A potential difference between the bit line 2 and the dummy cell bit line 12 begins to be generated. The potentials of the sense line 8 and the dummy cell sense line 18 go toward potentials to be finally set. In a period t5, the potentials of the bit line 2, the dummy cell bit line 12, the sense line 8 and the dummy cell sense line 18 are set to the final potentials, respectively. When a technique of equalizing the potentials of the bit line 2, dummy cell bit line 12, the sense line 8, and the dummy cell sense line 18 is simply applied to a conventional read circuit, after the equalization is completed, the potential relationship between the sense line 8 and the dummy cell sense line 18 is temporarily reversed, and a sense amplifier 20 temporarily outputs reverse data, thereby preventing reduction in access time.

Figure 5:
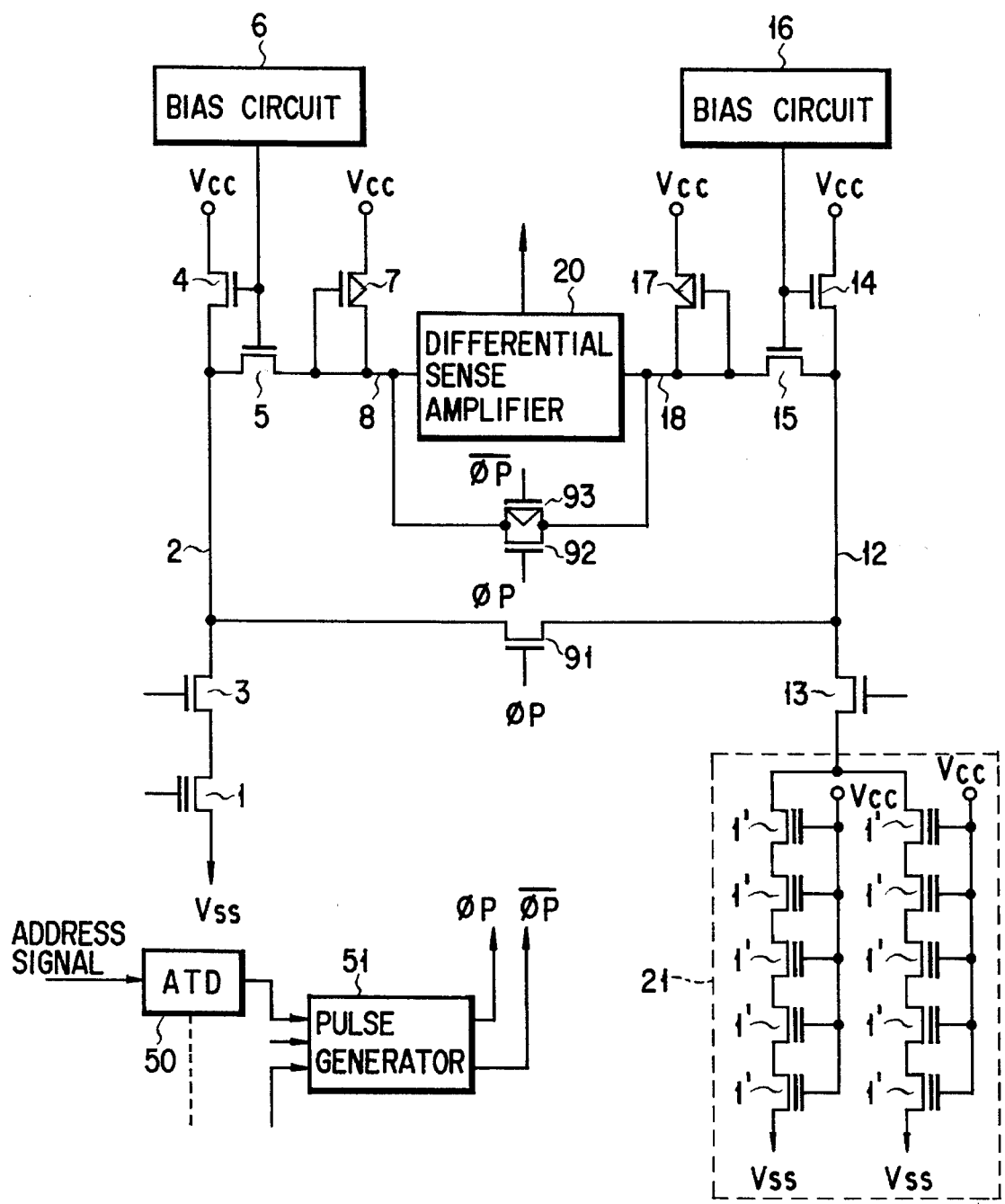
FIG. 5 is a circuit diagram showing a part of an EPROM according to the second embodiment of the present invention.

FIG. 5 is a circuit diagram showing a part of an EPROM of a nonvolatile semiconductor memory according to the second embodiment of the present invention. The circuit in FIG. 5 is different from the circuit in FIG. 2 in some relationships of transistors and the arrangement of a dummy cell circuit 21. The same reference numerals as in FIG. 2 denote the same parts in FIG. 5. In FIG. 5, the sizes of transistors are set as follows:

(size of transistor 7)/(size of transistor 5)
= (size of transistor 17)/(size of transistor 15)
= R1

In other words, (size of transistor 17)/(size of transistor 7)     (1)
= (size of transistor 17)/(size of transistor 5)
= R1

Furthermore, when a bit line charge transistor 4 and a dummy cell bit line charge transistor 14 are arranged, a ratio R2 of the sum of the size of the transistor 14 and the size of the transistor 15 to the sum of the size of the transistor 4 and the size of the transistor 5 is set to be 2.5. That is, (total size of transistors 14 and 15)/(total size of transistors 4 and 5)=R2=2.5  (2)

As is apparent from equations (1) and (2), the relationship between the size of the main memory cell charge transistor 4 and the size of the transfer gate transistor 5 must satisfy the following equation:

(size of transistor 14)/(size of transistor 15) + 1 =  (3)

{1 + (size of transistor 4)/(size of transisotr 5)}R2/R1

In this case, if the sizes of the transistors 4 and are equal to each other and a condition of R1=R2=2.5 is assumed, the following equation can be obtained from equation (3):

(size of transistor 14) = (size of transistor 15)
= 2.5 × (size of transistor 5)
= 2.5 × (size of transistor 4)

In addition, when the sizes of the transistor 4 and 5 are equal to each other and conditions of R1=1 and R2=2.5 are assumed, the following equations can be obtained from equation (3):

(size of transistor 14)  = 4 × (size of transistor 15)
(size of transistor 15)  = (size of transistor 5)
                         = (size of transistor 4)

As described above, as is apparent from equations (1) and (2), a large number of practical relationships which are satisfied by the sizes of the charge transistor 4 and the transfer gate transistor 5 in the main memory cell can be considered. In short, for simultaneously equalizing the potentials of the bit line and the dummy cell bit line and the potentials of the sense line and the dummy cell sense line, as in equation (1), a conductance ratio of the bit line load transistor 7 to the transfer gate transistor 5 must be set to be substantially equal to a conductance ratio of the dummy bit line load transistor 17 to the transfer gate transistor 15 (within a predetermined range of about 1, e.g., within a range of 0.9 to 1.1).

In the circuit of FIG. 5, in order to obtain a relatively simple circuit for satisfying the condition of equation (1), load conditions are set to be symmetrical, i.e., the conditions of (size of transistor 17)=(size of transistor 7)

(size of transistor 15)=(size of transistor 5)

(size of transistor 14)=(size of transistor 4)

are satisfied, and a current of the dummy cell is set to be 1/R2=1/2.5=0.4 times a cell current. In FIG. 5, as a practical circuit for satisfying the above conditions, the dummy cell 21 is used in place of a dummy cell 11 in FIG. 2. In the dummy cell 21, two sets of five series-connected cells 1' each having the same arrangement as that of the main memory cell are parallelly connected to each other, and a power source potential Vcc is applied to the control gates of the cells, thereby obtaining a current which is 0.4 times the cell current. As described above, when the condition of equation (1) is satisfied, after equalization of the potentials of the bit line and the dummy cell bit line and the potentials of the sense line and the dummy cell sense line is completed, the relationship between the potentials of the sense line and the dummy cell sense line is prevented from being temporarily reversed. A sense amplifier 20 is prevented from temporarily outputting reverse data. Therefore, a high-speed read operation can be sufficiently achieved.

FIG. 6 shows the waveforms of an equalizing signal φp, the potential of a bit line 2, the potential of a dummy cell bit line 12, the potential of a sense line 8, and the potential of a dummy cell sense line 18 during a read operation of the circuit in FIG. 5. FIG. 6 shows that a bit line potential is finally switched from low level to high level when a selected main memory cell 1 is set in a programmed state, and a cell current is set to be zero. When this read operation is compared with a read operation of the circuit in FIG. 2 with reference to FIG. 3, it is found that the potential of the sense line is prevented from being reversed in a period t3, and the operation waveforms in periods t2 to t4 are improved.

FIG. 7 is a circuit diagram showing another arrangement of the dummy cell 21 in FIG. 5. In this arrangement, a predetermined bias voltage generated by dividing a power source potential Vcc by load circuits 31 and 32 is applied to the control gate of the dummy cell 11 to obtain a current which is 0.4 times a cell current. In place of the operation of dividing the voltage by the resistors, the voltage may be divided by nonlinear elements such as transistors.

FIG. 8 is a circuit diagram showing still another arrangement of the dummy cell circuit 21 in FIG. 5. In this arrangement, when a current flowing in a cell 1' having the same arrangement as that of a main memory cell is divided using a current mirror technique, a current which is 0.4 times a cell current can be obtained. That is, a transistor 43 and the cell 1' are connected in series with an input transistor 42 of a first current mirror circuit 41, and an input transistor 46 of a second current mirror circuit 45 is connected to an output transistor 44 of the first current mirror circuit 41. The mirror ratio of the first current mirror circuit 41 is set to be R3, the mirror ratio of the second current mirror circuit 45 is set to be R4, and a condition of R3×R4=0.4 is satisfied. At this time, a current which is 0.4 times the cell current is obtained from an output transistor 47 of the second current mirror circuit 45. Note that a bias circuit 48 applies a bias voltage of about 3 V to the gate of the transistor 43 to clamp the drain voltage of the cell 1' to 1.5 V or less such that the cell 1' is prevented from soft write access during long-time read.

A method of overcoming the drawback posed such that when a cell current becomes small, the switching speed of the main memory cell 1 is decreased, and an access time considerably depends on the cell current in the circuit of FIG. 5 will be described below. In this method, even when dependency of the read rate on the cell current is small, a decrease in read rate is small even when the cell current is small.

Figure 9:
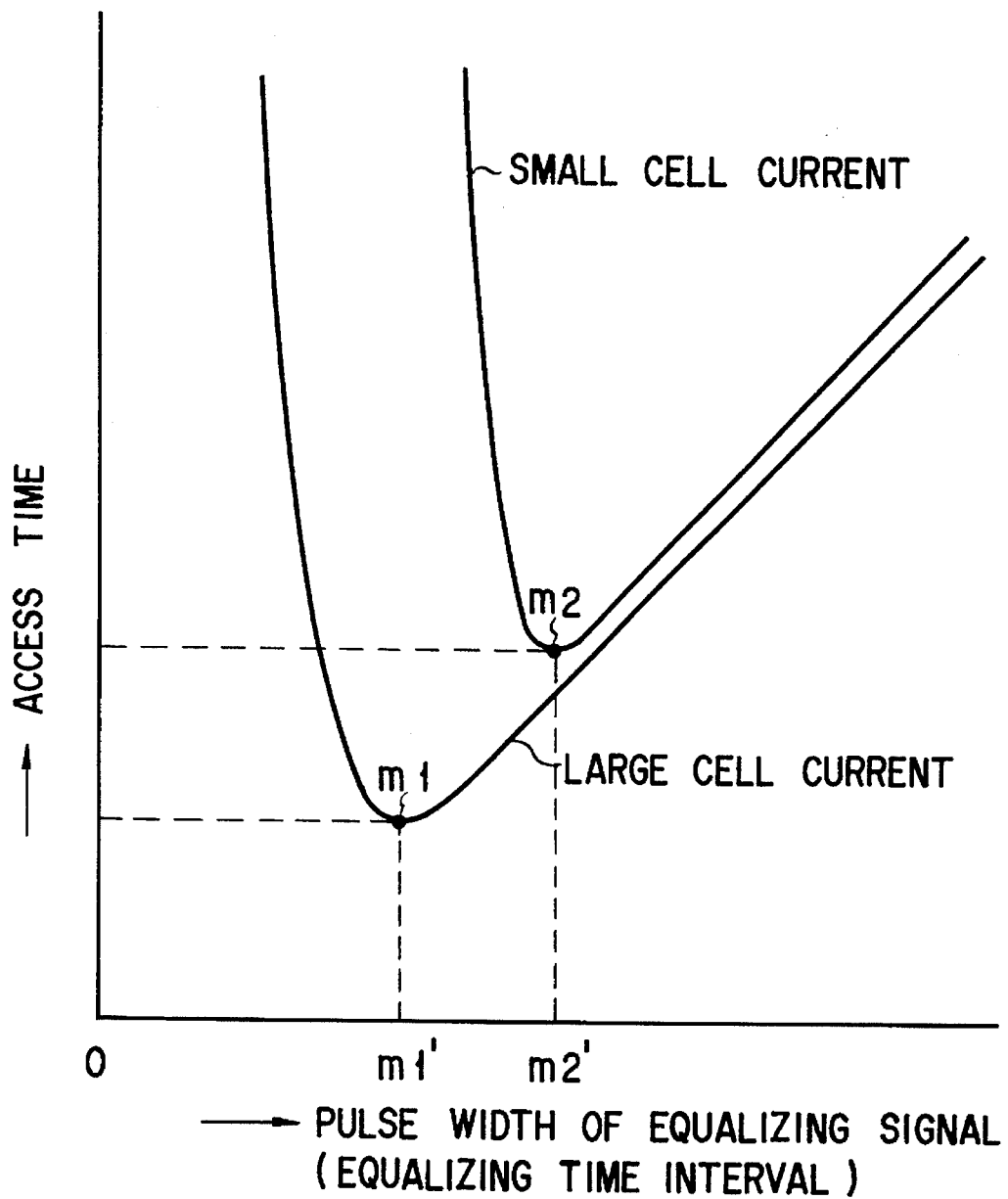
FIG. 9 is a graph showing a relationship between the pulse width of an equalizing signal p$\phi$ and an access time when a cell current is large and small in the circuit of FIG. 5.

FIG. 9 is a graph showing a relationship between the pulse width (equalizing time interval) of an equalizing signal φp and an access time when a cell current is small or large in the circuit of FIG. 5. In FIG. 9, reference symbols $\overline{om_1}'$ and $\overline{om_2}'$ represent equalizing time intervals for obtaining a maximum access time when the cell current is large and small, respectively. When a case wherein the cell current is large is compared with a case wherein the cell current is small, it is found that the minimum equalizing time intervals are different from each other. When the equalizing time interval is longer than the time interval $\overline{om_2}'$, an access time is not largely changed. When the equalizing time interval is shorter than the time intervals $\overline{om_1}'$ and $\overline{om_2}'$, the potentials of the bit line and the dummy cell bit line and the potentials of the sense line and the dummy cell sense line are insufficiently equalized. After this equalization is completed, reverse data is temporarily output from the sense amplifier 20, and the access time is prolonged. When the equalizing time interval is longer than the time intervals $\overline{om_1}'$ and $\overline{om_2}'$, although the potentials of the bit line and the dummy cell bit line and the potentials of the sense line and the dummy cell sense line are sufficiently equalized, the access time is prolonged in proportion to an increase in in equalizing time interval.

Figure 10:
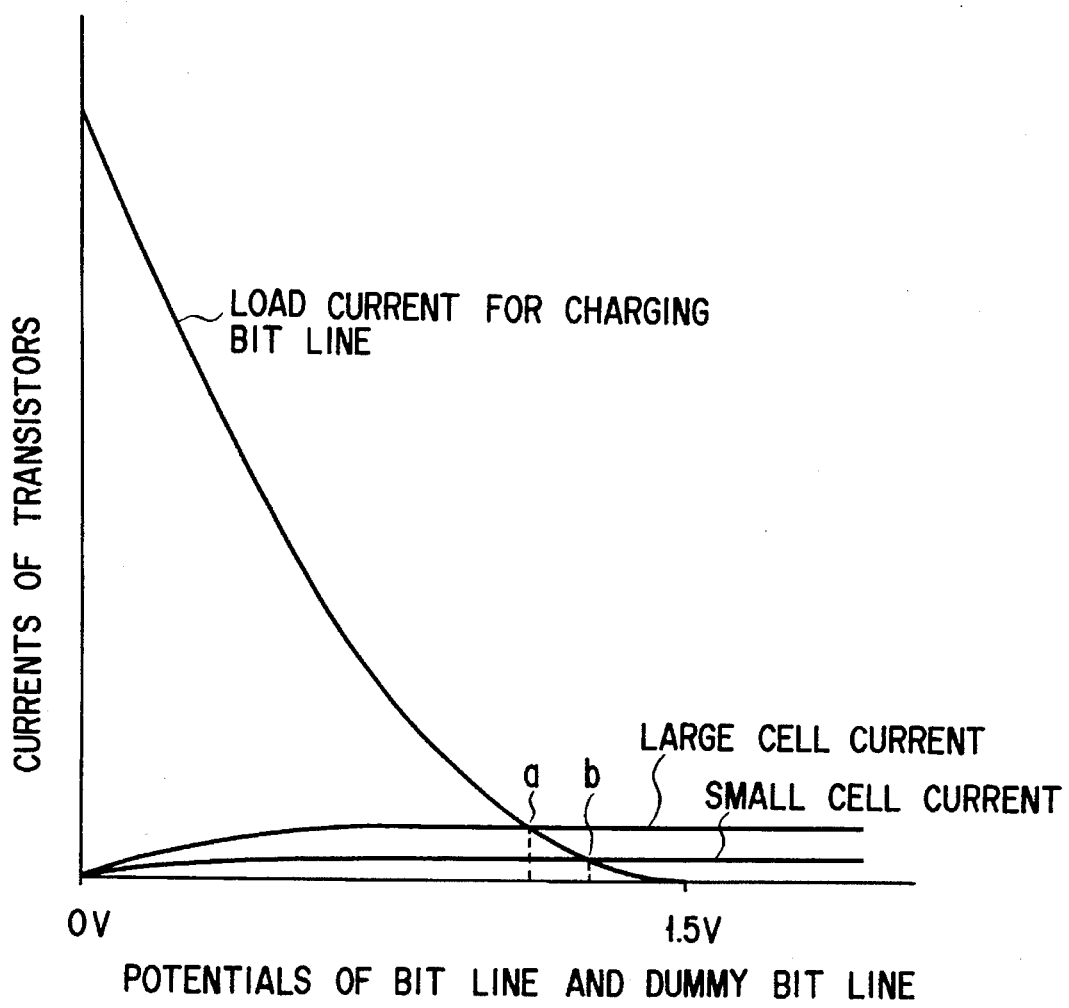
FIG. 10 is a graph showing the currents of a bit line charge transistor and a dummy bit line charge transistor as a function of a bit line potential and a dummy bit line potential.

FIG. 10 is a graph showing characteristic curves of the currents of the bit line charge transistor 4 and the dummy bit line charge transistor 14 as a function of the potentials of the bit line 2 and the dummy bit line 12 in FIG. 5 to examine the above phenomenon. Points a and b indicate balanced points at which a load current for charging the bit line and charge currents of the transistors 4 and 14 are balanced. As is apparent from FIG. 10, the charge current of the transistors 4 and 14 until reaching the balanced points a and b with respect to a large cell current is larger than that with respect to a small cell current. A potential amplitude of the bit lines 2 and 12 with respect to a large cell current is smaller than that with respect to a small cell current. For this reason, it is effective that the potentials of balanced points a and b, i.e., the potentials of the bit lines 2 and 12 in equalization period, are set to be low to shorten the equalizing time interval.

Figure 11:
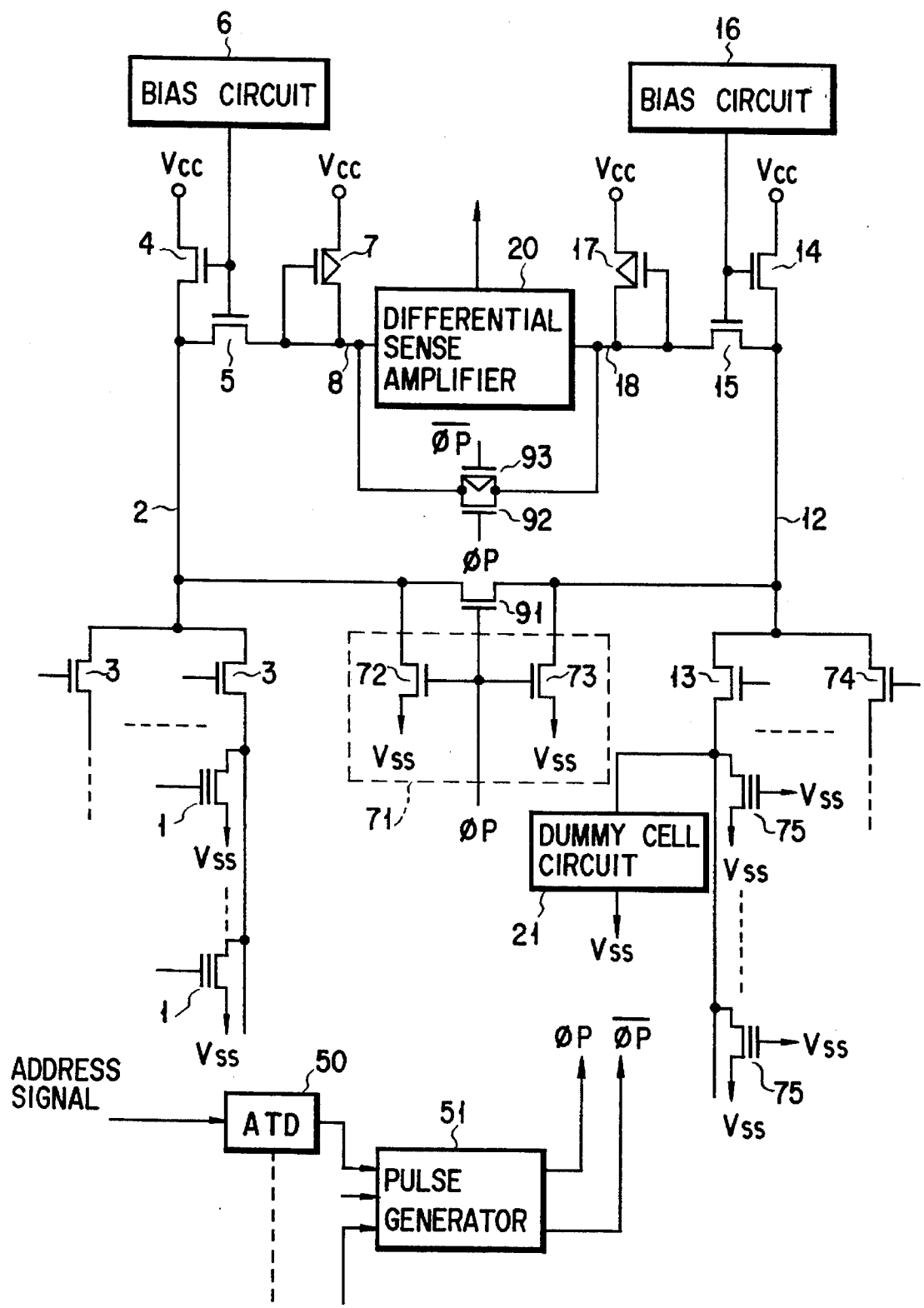
FIG. 11 is a circuit diagram showing a part of an EPROM according to the third embodiment of the present invention.

FIG. 11 is a circuit diagram showing a read circuit of an EPROM of a nonvolatile semiconductor memory according to the third embodiment of the present invention. The circuit of this embodiment is formed as follows. That is, in FIG. 5, the sizes of main memory cell transistors 7, 5, and 4 are equal to the sizes of dummy cell transistors 17, 15, and 14, respectively, and a discharge circuit 71 for decreasing the potential of a balanced point between a bit line 2 and a dummy bit line 12 is arranged as shown in FIG. 12. The discharge circuit 71 includes an enhancement N-channel transistor 72 connected between the bit line 2 and a ground node and an enhancement N-channel transistor 73 connected between the dummy bit line 12 and the ground node. An equalizing signal φp is supplied to the gates of the transistors 72 and 73. When the potential of a balanced point between the bit line 2 and the dummy bit line 12 is decreased by the discharge circuit 71 during an equalization period to be shifted from a conventional one, in order to rapidly increase a potential difference between a sense line 8 and a dummy cell sense line 18 when the equalization is completed, it is preferable that dummy transistors 74, 75, . . . , are connected to the dummy bit line 12 to balance the capacitance of the main memory cell with that of the dummy cell.

A technical concept in which the discharge circuit 71 is arranged can be applied to not only the circuit in FIG. 5 but other read circuits. When a load conductance for charging the dummy bit line is an Rc multiple of a conductance of the bit line in the main memory cell, in order to rapidly increase a potential difference between the sense line and the dummy sense line after the equalizing signal φp is disabled, the capacitance of the dummy bit line is set to be an Rc multiple of the capacitance of the bit line. In addition, as described above, a method of decreasing the potential of a balanced point between the bit line and the dummy bit line can also be applied to a semiconductor memory including a differential cell, such as an SRAM cell, having complementary bit lines.

In the present invention, not only a NOR memory cell array but a NAND memory cell can be used as a memory cell array. In addition, the present invention can be applied to not only a high-speed ROM but an intermediate-speed ROM including a bit line of a large capacitance. The present invention can be generally applied to not only a nonvolatile semiconductor memory such as an EPROM but an EEPROM (Electrically Erasable Programmable ROM) and a mask ROM (read-only memory).

In a nonvolatile semiconductor memory according to the present invention, the potentials of a bit line and a dummy cell bit line and the potentials of a sense line and a dummy cell sense line can be simultaneously equalized at high speed, thereby sufficiently achieving a high-speed read operation. Furthermore, in the nonvolatile semiconductor memory according to the present invention, when the potential of a balanced point between the bit line and the dummy bit line is decreased, dependency of an access time on a cell current is decreased. For this reason, even when the cell current is small, a decrease in an access time is small, and data can be sensed at high speed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nonvolatile semiconductor memory comprising:

a bit line;

a nonvolatile memory cell connected to said bit line for holding and decreasing a potential of said bit line in accordance with stored data by discharging the potential;

a sense amplifier, having first and second input terminals, for comparing the potentials of said first and second input terminals, and amplifying and outputting a difference between the potentials;

a first transfer gate connected between said bit line and said first input terminal of said sense amplifier and having a gate applied with a first bias voltage of a first predetermined value;

a first load circuit for charging said first input terminal of said sense amplifier;

a dummy bit line;

a dummy cell, connected to said dummy bit line, for decreasing a potential of said dummy bit line by discharging the dummy bit line potential;

a second transfer gate connected between said dummy bit line and said second input terminal of said sense amplifier and having a gate applied with a second bias voltage of a second predetermined value;

a second load circuit for charging said second input terminal of said sense amplifier;

a first equalizing circuit, connected between said first and second input terminals of said sense amplifier and controlled by a precharge signal, for equalizing potentials of said first and second input terminals of said sense amplifier during a precharge period; and a second equalizing circuit, connected between said dummy bit line and said bit line, for equalizing potentials of said bit line and said dummy bit line during the precharge period, wherein a conductance ratio of a first load generated by said first load circuit to said first transfer gate and a conductance ratio of a second load generated by said second load circuit to said second transfer gate are set within a range of 0.9 to 1.1.

2. A memory according to claim 1, wherein a final potential of said second input terminal of said sense amplifier during an access time in read mode is set at an intermediate potential between low and high levels of the potential of said first input terminal of said sense amplifier.

3. A memory according to claim 1, further comprising a detector for detecting transition of an address signal supplied from an external circuit and a pulse generator for generating a pulse signal having a predetermined pulse width in response to an output from said detector, the pulse signal being the precharge signal and a period for generating the pulse signal being the precharge period.

4. A memory according to claim 1, wherein a ratio between a conductance of a load for charging said dummy bit line and a conductance of a load for charging said bit line is set to be equal to a ratio between a parasitic capacitance of said dummy bit line and a parasitic capacitance of said bit line.

5. A memory according to claim 1, further comprising a circuit, connected to said dummy bit line, for generating the potential of said dummy bit line and discharging said dummy bit line with a current which is proportional to an ON current of said nonvolatile memory cell.

6. A memory according to claim 5, further comprising a detector for detecting transition of an address signal supplied from an external circuit and a pulse generator for generating a pulse signal having a predetermined pulse width in response to an output from said detector, so that the pulse signal is used as the precharge signal, and a period for generating the pulse signal is the precharge period.

7. A memory according to claim 5, wherein a ratio between a conductance of a load for charging said dummy bit line and a conductance of a load for charging said bit line is set to be equal to a ratio of a parasitic capacitance of said dummy bit line and a parasitic capacitance of said bit line.

8. A memory according to claim 5, wherein said circuit includes said dummy cell, said dummy cell comprising plural parallel-connected sets of plural series-connected cells, each of said plural series-connected cells having a power source potential applied to a control gate of said cells.

9. A memory according to claim 1, further including a plurality of third load circuits for dividing a power source potential to generate a voltage, the voltage being applied to a control gate of said dummy cell.

10. A memory according to claim 1, wherein a current, obtained by dividing a current of said dummy cell using a current mirror technique, flows in said dummy bit line.

11. A nonvolatile semiconductor memory comprising:

a first bit line;

a first memory cell connected to said first bit line for holding and decreasing a potential of said first bit line in accordance with stored data by discharging the first bit line potential;

a sense amplifier, having first and second input terminals, for comparing the potentials of said first and second input terminals, and amplifying and outputting a difference between the potentials;

a first transfer gate connected between said first bit line and said first input terminal of said sense amplifier and having a gate applied with a first bias voltage;

a first load circuit for charging said first input terminal of said sense amplifier;

a second bit line;

a second memory cell, connected to said second bit line, for decreasing a potential of said second bit line by discharging the second bit line potential;

a second transfer gate connected between said second bit line and said second input terminal of said sense amplifier and having a gate applied with a second bias voltage;

a second load circuit for charging said second input terminal of said sense amplifier;

a first equalizing circuit, connected between said first and second input terminals of said sense amplifier and controlled by a precharge signal, for equalizing potentials of said first and second input terminals of said sense amplifier during a precharge period; and a second equalizing circuit, connected between said first bit line and said second bit line, for equalizing potentials of said first bit line and said second bit line during the precharge period, wherein a conductance ratio of a first load generated by said first load circuit to said first transfer gate and a conductance ratio of a second load generated by said second load circuit to said second transfer gate are set to be approximately equal.

* * * * *